United States Patent
Park et al.

(10) Patent No.: US 8,906,787 B2
(45) Date of Patent: Dec. 9, 2014

(54) THIN FILM COMPOSITIONS AND METHODS

(71) Applicant: Cornell University, Ithaca, NY (US)

(72) Inventors: Jiwoong Park, Ithaca, NY (US); Mark Levendorf, Mansfield, OH (US); Cheol-Joo Kim, Ithaca, NY (US); Lola Brown, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 14/046,947

(22) Filed: Oct. 5, 2013

(65) Prior Publication Data

US 2014/0097537 A1    Apr. 10, 2014

Related U.S. Application Data

(60) Provisional application No. 61/710,487, filed on Oct. 5, 2012.

(51) Int. Cl.
*H05K 1/09* (2006.01)
*H05K 3/02* (2006.01)
*H05K 3/06* (2006.01)
*H05K 3/36* (2006.01)

(52) U.S. Cl.
CPC .. *H05K 1/09* (2013.01); *H05K 3/02* (2013.01); *H05K 3/06* (2013.01); *H05K 3/36* (2013.01)
USPC .......................................... 438/478; 257/741

(58) Field of Classification Search
USPC .......................................... 438/478; 257/741
See application file for complete search history.

(56) References Cited

U.S. PATENT DOCUMENTS

2013/0196463 A1 * 8/2013 Zhu ................................ 438/52
2013/0270511 A1 * 10/2013 Cai et al. ........................... 257/9

* cited by examiner

*Primary Examiner* — Marc Armand
(74) *Attorney, Agent, or Firm* — Valauskas Corder LLC

(57) ABSTRACT

Certain embodiments of the present invention include a versatile and scalable process, "patterned regrowth," that allows for the spatially controlled synthesis of lateral junctions between electrically conductive graphene and insulating h-BN, as well as between intrinsic and substitutionally doped graphene. The resulting films form mechanically continuous sheets across these heterojunctions. These embodiments represent an element of developing atomically thin integrated circuitry and enable the fabrication of electrically isolated active and passive elements embedded in continuous, one atom thick sheets, which may be manipulated and stacked to form complex devices at the ultimate thickness limit.

18 Claims, 14 Drawing Sheets

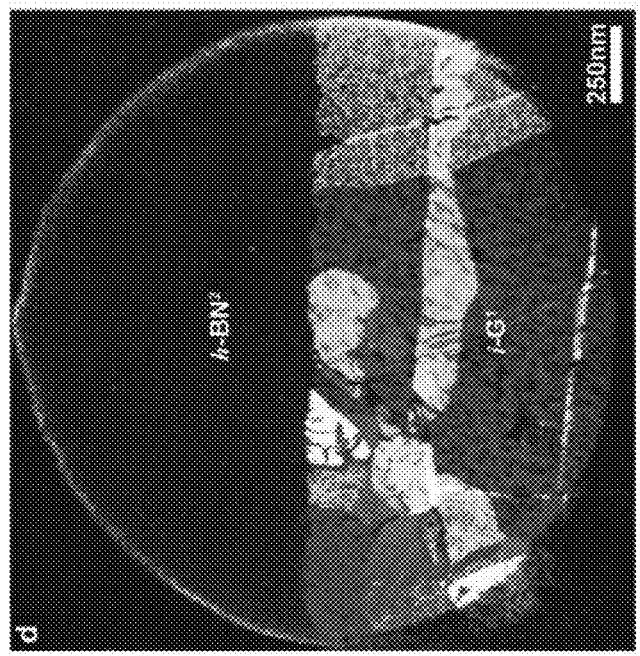
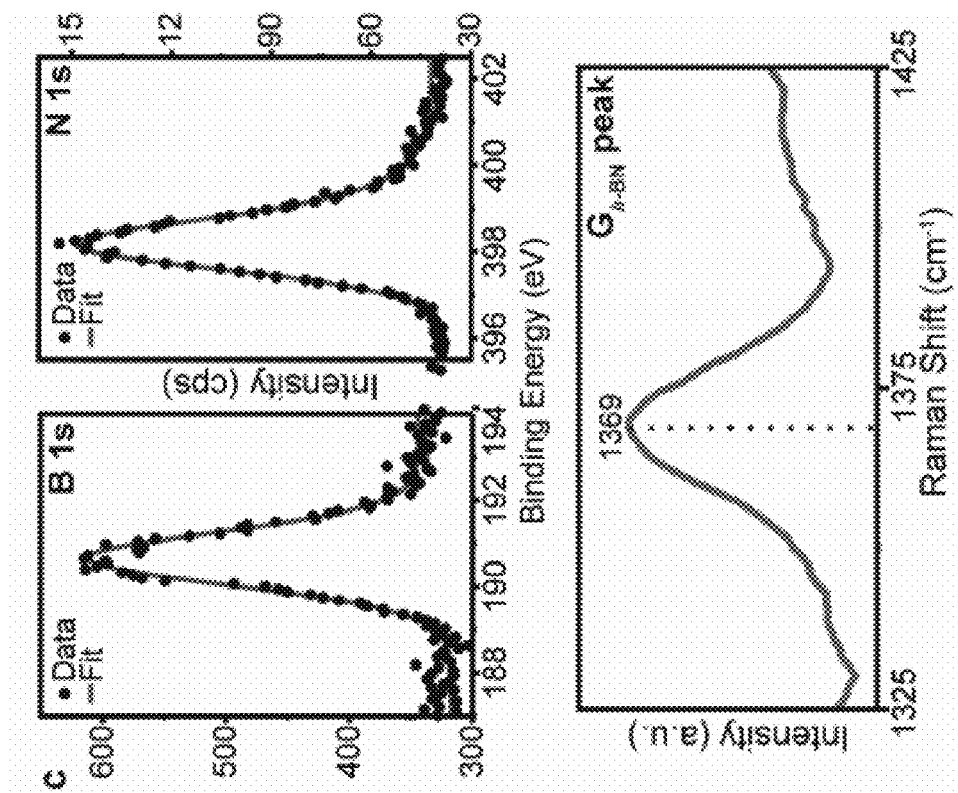
FIG. 2C
FIG. 2D

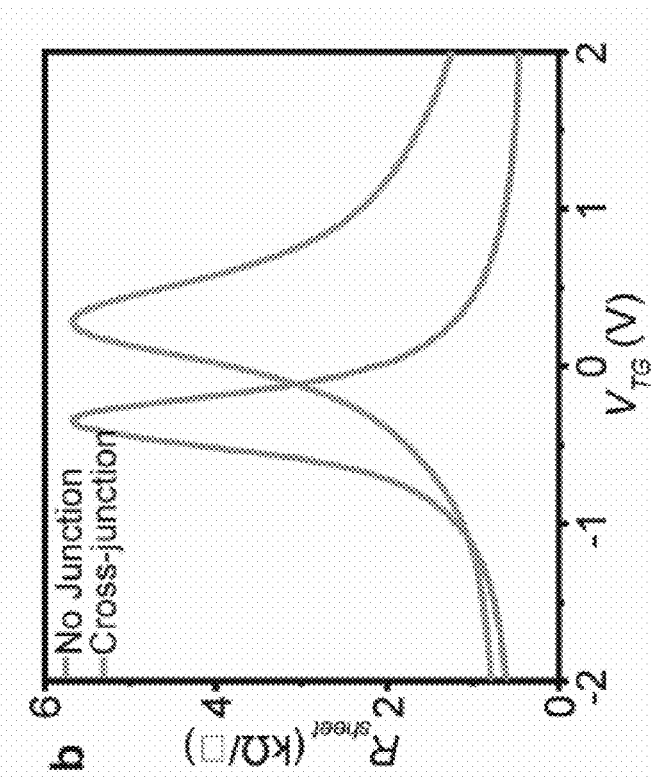
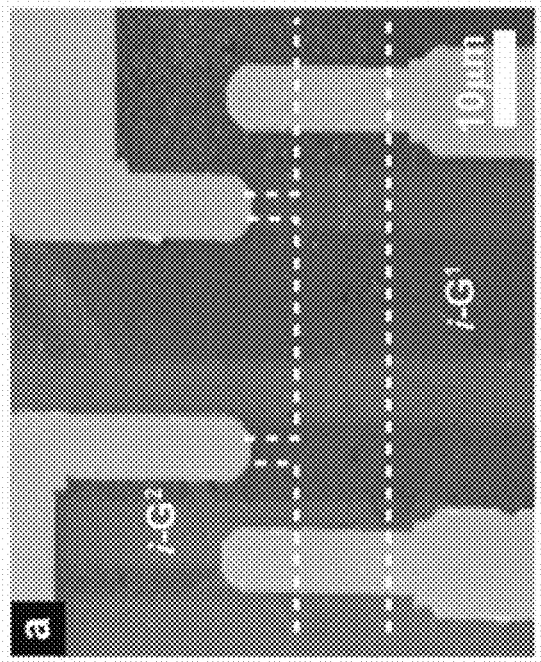
FIG. 4A                    FIG. 4B

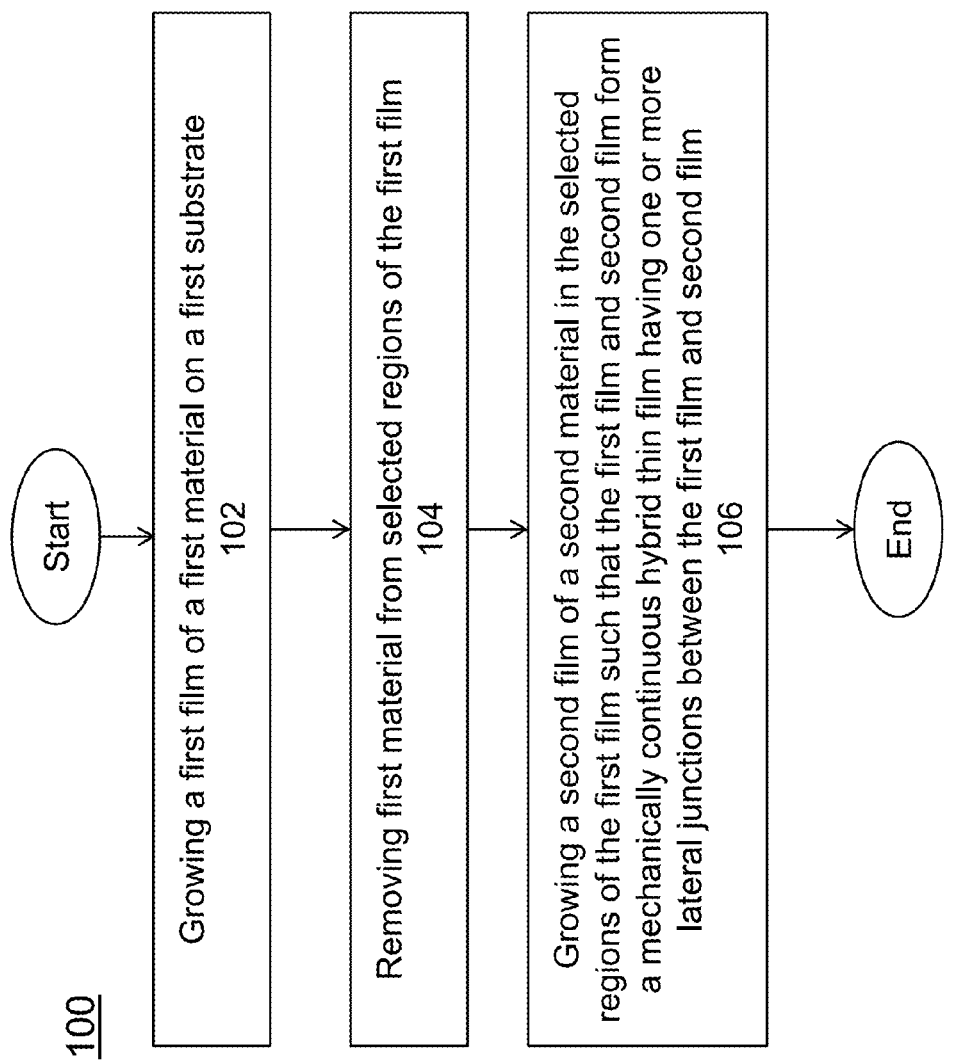

THIN FILM COMPOSITIONS AND METHODS

CROSS REFERENCE TO RELATED APPLICATIONS

This application claims the benefit of U.S. Provisional Application No. 61/710,487 filed Oct. 5, 2012, which is incorporated by reference in its entirety.

STATEMENT REGARDING FEDERALLY SPONSORED RESEARCH/DEVELOPMENT

This invention was made with government support under FA9550-09-1-0691 and FA9550-10-1-0410, awarded by Air Force Office of Scientific Research, and under DMR-1120296, DGE-0707428, and ECS-0335765, awarded by the National Science Foundation. The United States government has certain rights in the invention.

FIELD OF THE INVENTION

The present invention relates generally to thin film compositions and methods.

BACKGROUND OF THE INVENTION

Precise spatial control over the electrical properties of thin films is required in the production of modern integrated circuitry. Although recent advancements in chemical vapor deposition (CVD) methods have allowed the large scale production of both intrinsic and doped graphene, as well as hexagonal boron nitride (h-BN), controlled fabrication of lateral heterostructures in truly atomically thin systems has not been achieved. Graphene/h-BN interfaces are of particular interest as it is known that areas of different atomic compositions may coexist within continuous atomically thin films, and that the bandgap and magnetic properties can be precisely engineered with proper control. Previously reported approaches for controlling these interfaces have fundamental limitations and cannot be easily integrated with conventional lithography.

Certain methods for preparing thin films are known. However, those methods do not permit the user to precisely control the arrangement of atoms in the thin film structure. The arrangement of atoms may affect the electrical properties of the thin film. Clearly, it would be valuable to control the electrical properties of the thin film for applications such as computer memory.

Other known procedures for preparing thin films permit a user to control the arrangement of atoms or arrangement of materials in the thin film. However, such procedures may cause damage to the structure of atoms or are incompatible with other related processes, such as lithography. Other known procedures that permit control of atom arrangement are not applicable to or are not compatible with generally two-dimensional film.

There is a demand for a thin film compositions and methods suitable for use in a two-dimensional film, which may be integrated with lithography, and permit user control over the arrangement of atoms, thereby permitting control of electrical properties of the thin film. The present invention satisfies this demand.

SUMMARY OF THE INVENTION

Certain embodiments of the present invention include a thin film system and methods.

In certain embodiments of the present invention, two or more types of material are combined to form a continuous thin film. The different materials may have different properties. For example, a first material may be an electrically conductive material and a second material may not be electrically conductive and may have insulating properties. In one such embodiment, the conductive material is graphene and the insulating material is hexagonal boron nitride (h-BN). Graphene may include intrinsic graphene and substitutionally-doped graphene.

For purposes of this application, a method for preparing a continuous thin film by combining two or more types of material is termed "patterned regrowth".

An embodiment of a method of creating a continuous thin film sheet having at least two materials may comprise a number of steps. A first film of a first material, such as graphene, may be grown on a first substrate, such as copper or other appropriate substrate, including those currently known in the art. The first film may be a minimal thickness, for example, one atom layer thick or a few atom layers thick.

In certain embodiments, a layer of photoresist may be deposited on the first film. Selected regions of the first film are removed to form a patterned film. Portions of the first film material may be removed, for example, using photolithography and reactive ion etch, or other steps known in the art for patterning a section of graphene or other first material. Next, a second material is grown, for example, in the regions from which portions of the first film was removed to form a continuous thin film. The second material may include a second type of graphene or hexagonal boron nitride.

After formation, the continuous thin film may be transferred to a second type of substrate.

Embodiments of a continuous thin film may be, for example, physically continuous, electrically continuous, or mechanically continuous. In certain continuous embodiments, an edge of a first material may be joined to an edge of a second material along what is termed a "lateral heterojunction".

An objective of certain embodiments of the present invention is to create a continuous thin film having more than one material in which the user controls the position of a first material relative to at least a second material.

Another objective of certain embodiments of the present invention is to permit a user to control the junctions between a first material relative to a second material in a thin film.

Another objective of certain embodiments of the present invention is to build a thin film system having a specific bandgap.

The present invention and its attributes and advantages will be further understood and appreciated with reference to the detailed description below of presently contemplated embodiments, taken in conjunction with the accompanying drawings.

BRIEF DESCRIPTION OF THE DRAWINGS

The preferred embodiments of the invention will be described in conjunction with the appended drawings provided to illustrate and not to the limit the invention, where like designations denote like elements, and in which:

FIG. 2C presents XPS data for an i-G$^1$/h-BN$^2$ sheet (h-BN$^2$ grown in a more reactive environment relative to FIG. 2a), showing a 1:1.08 B:N atomic ratio (upper), and Raman spectroscopy confirms the presence of the h-BN G peak (lower);

FIG. 2D is a false color DF-TEM image of a suspended i-G$^1$/h-BN$^2$ sheet with the junction region visible;

FIG. 2G also shows an intensity profile of g-C and boron, indicating no voids or overlap in the junction region (lower panel);

FIG. 3A also shows two terminal I-V characteristics of the indicated devices, with graphene showing conducting behavior and h-BN exhibiting insulating characteristics ($R_{sheet}$>400 TΩ□$^{-1}$) (right panel);

FIG. 3B also shows are optical images of increasing magnification of a final device substrate with each layer contacted by electrodes (lower left panel, right panel, and inset);

FIG. 3C also includes an EFM phase image of the same junction (right panel). Both graphene strips are visible. Two-terminal I-V characteristics (inset; $R_{sheet}$>3 kTΩ□$^{-1}$) show no additional contact resistance owing to the graphene-graphene contact;

FIG. 4A is an SEM image with false color overlay of an i-G$^1$ (red)/i-G$^2$ (blue) cross-junction device before patterning;

FIG. 4B shows four-terminal gate dependence for devices without (grey) and with (orange) i-G$^1$/i-G$^2$ junctions, showing very similar peak resistances;

FIG. 6 is a flowchart illustrating a method embodiment of the present invention.

DETAILED DESCRIPTION OF EMBODIMENTS OF THE INVENTION

Certain embodiments of the present invention include a versatile and scalable process, termed "patterned regrowth," that allows for the spatially controlled synthesis of lateral junctions between electrically conductive graphene and insulating h-BN, as well as between intrinsic and substitutionally doped graphene. The resulting films form mechanically continuous sheets across these heterojunctions. Conductance measurements confirm laterally insulating behavior for h-BN regions, while the electrical behavior of both doped and undoped graphene sheets maintain excellent properties, with low sheet resistances and high carrier mobilities. These results represent an important step towards developing atomically thin integrated circuitry and enable the fabrication of electrically isolated active and passive elements embedded in continuous, one atom thick sheets, which could be manipulated and stacked to form complex devices at the ultimate thickness limit.

Figure 1A:
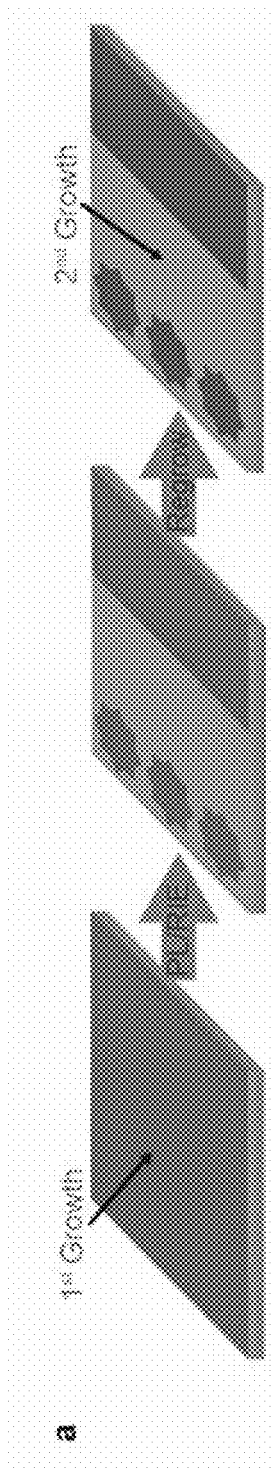
FIG. 1A is a schematic representation showing patterned regrowth of atomically thin lateral heterojunctions.
Figure 1B:
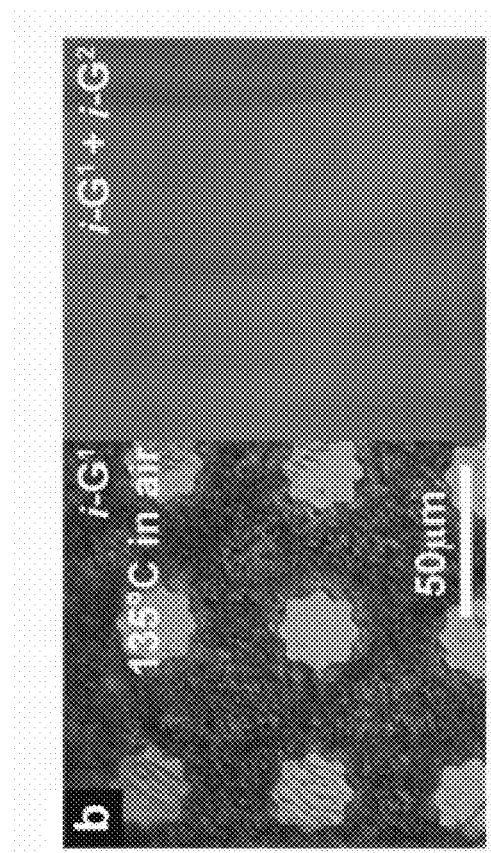
FIG. 1B is an optical image of a patterned Cu/intrinsic-first grown graphene (i-$G^1$) foil oxidized to enhance contrast (left) and following reduction of $CuO_x$ and subsequent growth of intrinsic-graphene (i-$G^2$) (right)

An approach for patterned regrowth is represented schematically in FIG. 1A. With reference to FIG. 1A, a first film of graphene (G$^1$, superscript representing the growth order) is grown on a substrate. A protective layer of photoresist is then deposited and unwanted areas are patterned away. Next, a second layer of graphene or h-BN (G$^2$/h-BN$^2$) is grown and the hybrid film is transferred onto the desired substrate for further characterization. Growths may be performed on Cu foil using standard literature recipes for both graphene and h-BN growths. Introducing dopant gases during any graphene growth stage allows us to produce both intrinsic (i-G; H$_2$+CH$_4$) and n-doped graphene (n-G; NH$_3$+H$_2$+CH$_4$) in a single process run. FIG. 1B shows optical images of the Cu growth substrate at different steps of the process. After patterning the first graphene layer, the substrate was heated to 135° C. in air to enhance contrast, as is shown in FIG. 1B (left); the areas of Cu protected by i-G$^1$ remain unoxidized whereas the unprotected areas are oxidized. FIG. 1B (right) shows the same foil after reduction of CuO$_x$ and subsequent synthesis of the second graphene, and demonstrates the homogeneity of the Cu/graphene substrate. Prior to further characterization, the presence of graphene was confirmed using micro Raman spectroscopy.

Figure 1D:
FIG. 1D is an enlarged image of a junction region.
Figure 1E:
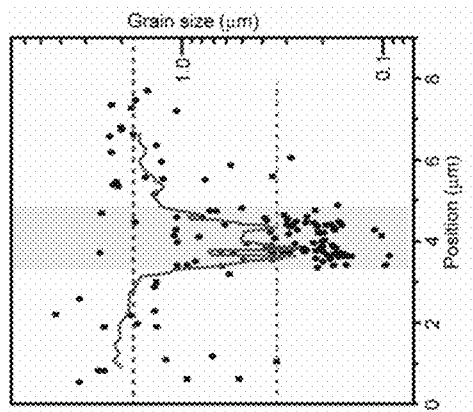
FIG. 1E is a plot of grain size vs position in the box outlined in FIG. 1C.
Figure 1C:
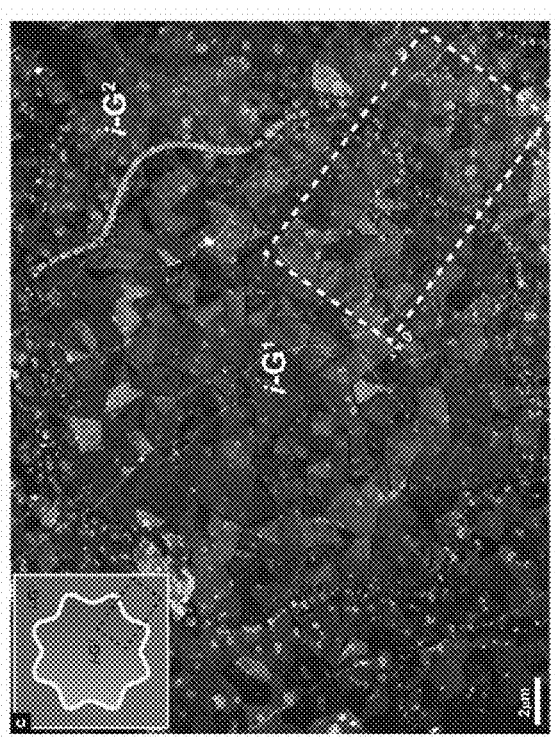
FIG. 1C is a false color dark field transmission electron microscopy (DF-TEM) image of an i-G$^1$/i-G$^2$ patterned area (schematic in inset)

The fidelity of the transferred pattern and the quality of the junctions formed by an embodiment of the method were studied using dark field transmission electron microscopy (DF-TEM), in which use of a specific objective aperture filter allows imaging of areas with corresponding lattice orientations. Multiple such images can then be colored and overlaid to form a complete map of the film, resolving the grain structure and number of layers with nanometer scale resolution, near and away from the junction area. FIG. 1C shows a composite image of a graphene sample that includes both the first and second grown areas as well as the junction between the two. For this, growths of i-G$^1$/i-G$^2$ were transferred onto 10 nm thick Si$_3$N$_4$ TEM membranes. Both G$^1$ and G$^2$ regions (see FIG. 1C inset) are comprised of single crystals of similar sizes, which indicates that the polycrystalline structure of the graphene is mainly determined by the synthesis conditions rather than the growth order, and also that the structure of the first grown graphene is unaffected by the patterned regrowth. Significantly, the location of the junction closely follows the designed pattern within the resolution of the instrument (FIG. 1C, partially outlined).

The DF-TEM data and electrical characterization, in addition to the growth conditions, suggest that the junction between G$^1$ and G$^2$ areas are laterally connected. Recent work has shown that a more reactive growth environment produces graphene-graphene grain boundaries with high quality lateral connections and minimal interdomain electrical resistance, while a less reactive one results in poorly-connected or even overlapped junctions. In the patterned regrowth process, highly reactive growth conditions may be used DF-TEM images of the junction areas indeed show high quality, continuous growth of graphene between G$^1$ and G$^2$ areas (FIG. 1D), indicating that the crystallinity is maintained uniformly across this region without amorphous carbon or voids, within the spatial resolution of DF-TEM (~10 nm). Furthermore, the electrical characterization across these junctions (see FIG. 4) shows a low junction resistance, similar to that of the high-quality, laterally-connected graphene grain boundaries known in the art.

A highly reactive environment promotes uniform lateral connectivity through increased nucleation at the junction area. FIG. 1E includes a plot grain size as a function of position within the box indicated in 1c. While both G$^1$ and G$^2$ regions show average grain sizes of ~1.7 μm, near the junction they are much smaller (mean ~0.33 μm). The moving average (FIG. 1E, red line) shows that the width of this area with smaller grains is approximately 2 μm, comparable to the average G$^1$ and G$^2$ grain size. This, in addition to the increased density of small bilayer areas (bright spots, see FIGS. 1C and 1D), suggests that the junction between G$^1$ and G$^2$ is formed by graphene nucleated and grown in the junction area rather than by direct stitching between grains nucleated away from it. This suggests edge nucleated growth, which is similar to a "seeding" effect known in the art. In contrast, regrowth under less-reactive conditions that provide slower growth do not produce well connected junctions in both graphene/graphene and graphene/h-BN films.

Figures 2A, 2B, 2F:
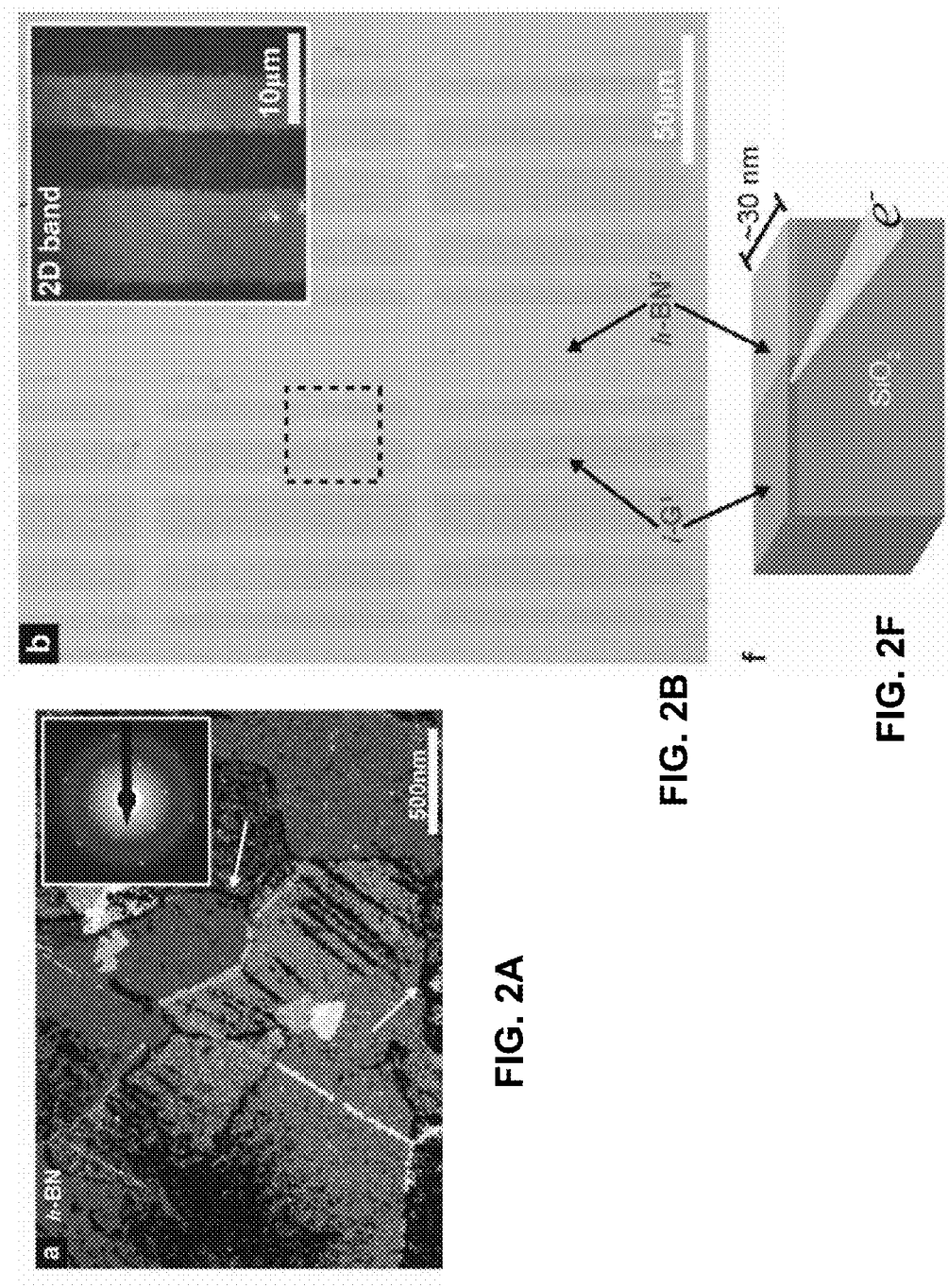
FIG. 2A is a false color DF-TEM image of a hexagonal boron nitride (h-BN) sheet grown in an environment of low reactivity.
FIG. 2B is an optical image of i-G$^1$ (darker areas)/h-BN$^2$ (lighter areas) on a Si/SiO$_2$ substrate. Inset: Raman graphene 2D band showing a stark contrast between the regions.
FIG. 2F is a schematic representation showing cross-sectional STEM EELS.
Figure 2E:
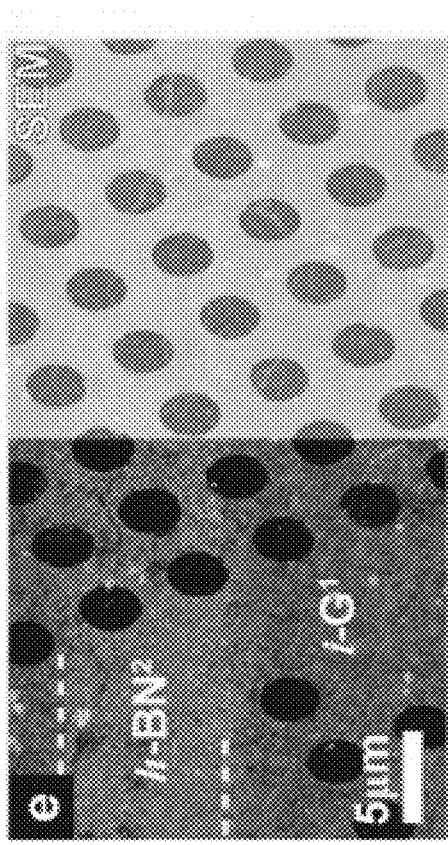
FIG. 2E is an SEM image of i-G$^1$/h-BN$^2$ film suspended over 2 µm sized holes; higher contrast (left) highlights i-G$^1$/h-BN$^2$ regions, whereas lower contrast (right) shows the suspended film.

The technique described above is also applicable to the formation of insulator-metal lateral junctions using graphene and h-BN (FIG. 2), which is discussed below (see Methods). FIG. 2A shows a false color DF-TEM image of a single layer h-BN sheet—as confirmed by Raman spectroscopy and X-ray photoelectron spectroscopy (XPS)—with relatively large domains in excess of 1 μm. Electron diffraction also shows that the film consists of single crystals with hexagonal lattice structures (FIG. 2A, inset). This h-BN growth, however, yields films that are mechanically discontinuous, as indicated by the dark lines in FIG. 2A (arrows, also visible in brightfield TEM). Instead, h-BN grown under more reactive conditions (higher precursor flow rate, see Methods) results in a continuous film, while exhibiting all the known characteristics of h-BN sheets. This is confirmed by the XPS data in FIG. 2C (upper; B and N in a 1:1.08 atomic ratio) and Raman spectroscopy (lower; h-BN G peak).

Careful control over the length of the h-BN$^2$ growth allows for the synthesis of i-G$^1$/h-BN$^2$ sheets with high pattern fidelity, as shown by the optical image in FIG. 2b. The darker regions indicate areas of i-G$^1$ (stronger absorption) whereas the lighter regions are comprised of h-BN$^2$. This, as well as the 2-dimensional Raman image (FIG. 2b, inset) of the graphene 2D band intensity, confirms the successful pattern transfer to the i-G$^1$/h-BN$^2$ hybrid sheet. Furthermore, DF-TEM of suspended films confirms a sharp junction, as is shown in FIG. 2d, where the grains of the i-G$^1$ growth (lower, colored) end abruptly at the interface with the h-BN$^2$ (upper). Both the brightfield TEM and SEM images (FIG. 2E) show a mechanically continuous sheet that is cleanly suspended with no breaks or tears at the junction region, confirming the stability and integrity of these growths. There is similar mechanical continuity for both i-G$^1$/i-G$^2$ and n-G$^1$/i-G$^2$ growths.

Figure 2G:
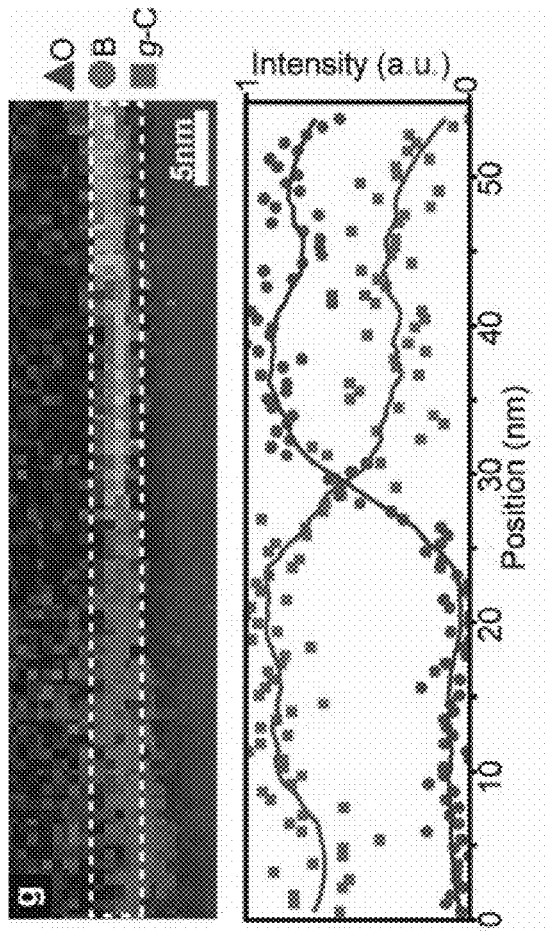
FIG. 2G is an elemental map of an i-G$^1$/h-BN$^2$ junction region showing graphitic carbon (red; g-C), boron (green), and oxygen (blue) (upper panel)

The composition of G/h-BN heterojunctions at the nanometer scale was investigated by cross-sectional imaging and chemical mapping of the i-G$^1$/h-BN$^2$ interface using an aberration corrected scanning transmission electron microscope (STEM) and electron energy loss spectroscopy (EELS). For this, using a focused ion beam, a thin (~30±5 nm) slice containing a junction region is carved out from a film of i-G$^1$/h-BN$^2$ transferred onto a Si/SiO$_2$ substrate (see FIG. 2F). FIG. 2G (upper) shows the resultant EELS composition maps across a junction region, where a line heterojunction is clearly seen between two neighboring regions with homogeneous atomic concentration. The left side indicates a high level of graphitic carbon (red; g-C), suggesting it belongs to graphene, whereas the other side has a high concentration of boron (green) originating from h-BN. Significantly, an increase in intensity of B corresponds to a decrease in g-C, as shown by the line profiles of the concentration of boron and g-C in the junction region (FIG. 2G, lower), strongly suggesting that the G/h-BN junction is a lateral heterojunction with a compositional transition width of less than 10 nm.

Figure 3A:
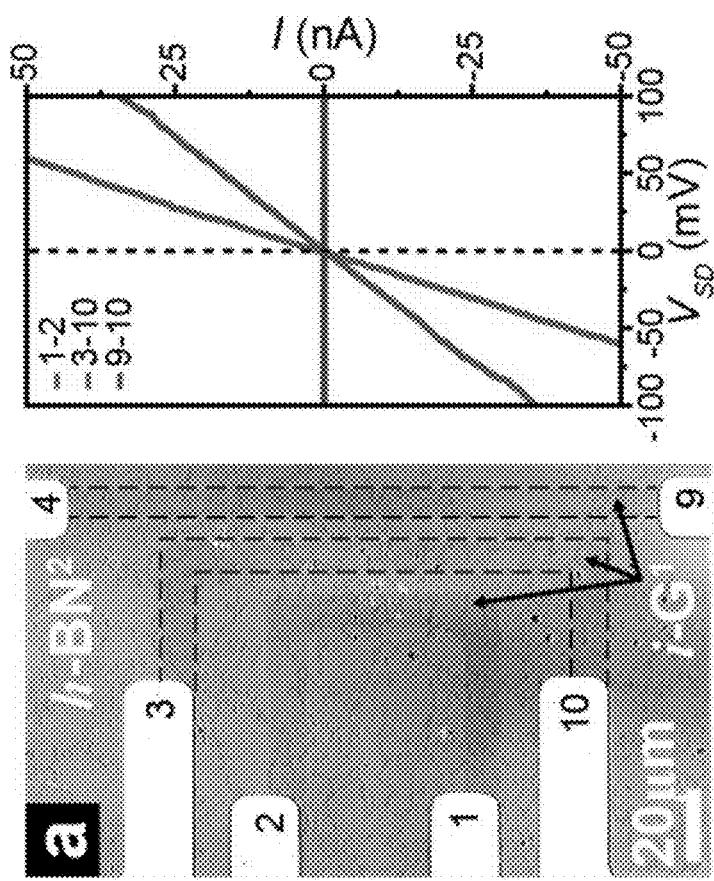
FIG. 3A is an optical image of an i-G$^1$/h-BN$^2$ sheet with electrodes contacting graphene strips (outlined by dotted lines) (left panel)
Figure 3B:
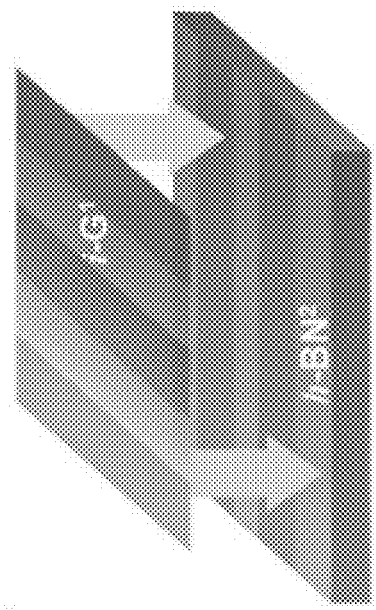
FIG. 3B provides a schematic of a multiple transfer process for ultraflat three-dimensional interconnects (upper left panel)
Figure 3B:
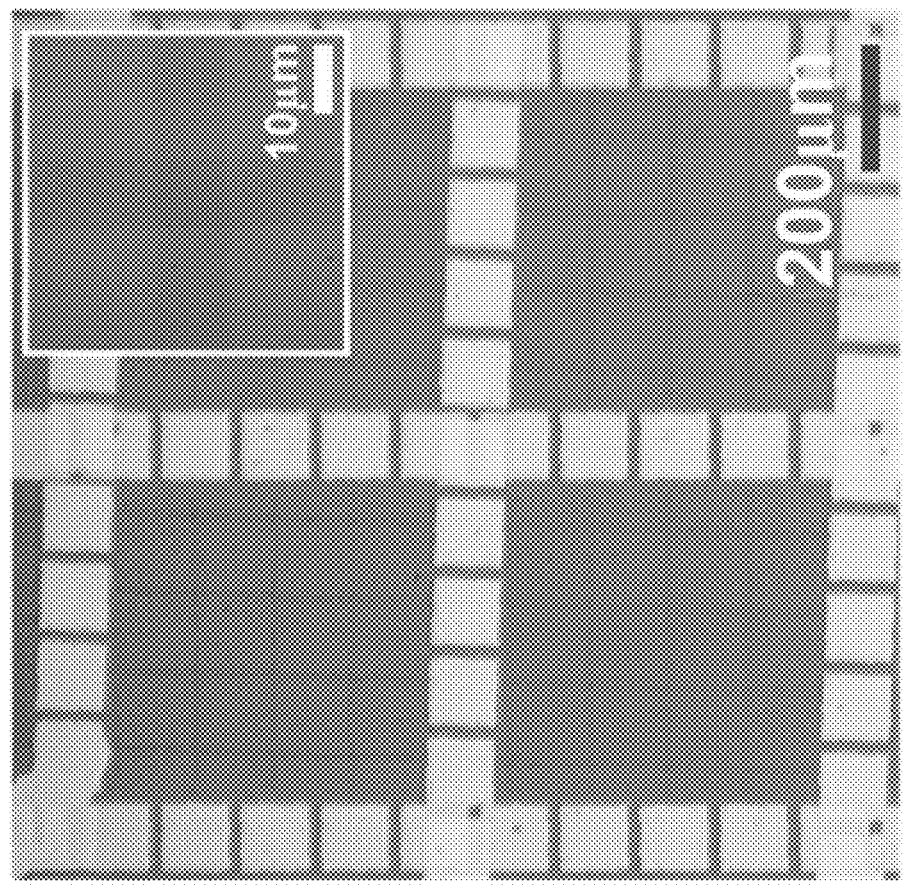
Figure 3C:
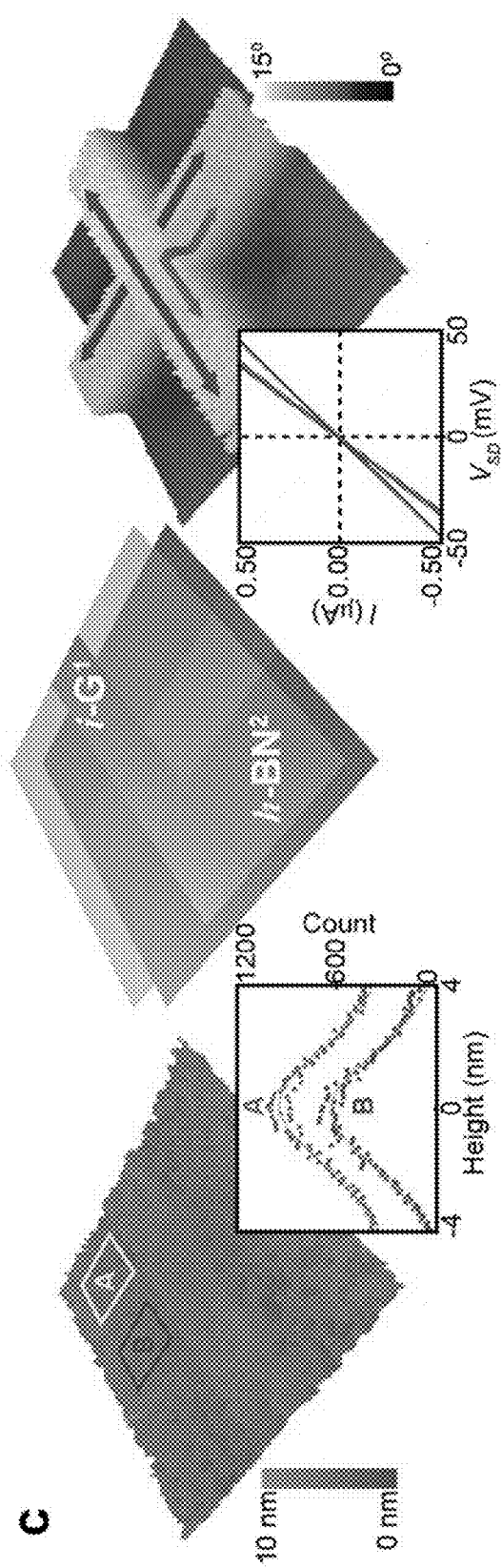
FIG. 3C is a schematic of a G$^1$-G$^1$ cross-junction (middle panel) and also shows an AFM height image of the cross (left panel); region A(h-BN on h-BN) is virtually indistinguishable from region B (h-BN on graphene), as indicated by the histogram (inset)

Successful synthesis of these hybrid films allows us to fabricate electrically isolated graphene devices in a single, atomically flat sheet, which is shown in FIG. 3A. Conducting behavior may be confined to the patterned graphene areas, with the h-BN$^2$ showing no conductivity within the limits of certain equipment (R$_{sheet}$>400 TΩ/□). An assessment is done to determine whether h-BN is free of small conducting pockets of h-BNC (boron-nitrogen-carbon) that might form during the growth using electrostatic force microscopy (EFM) (FIG. 3C, right). The EFM phase shift is highly uniform within both the i-G$^1$ and h-BN$^2$ regions, however there is an abrupt change in the phase shift at the junction between i-G$^1$ and h-BN$^2$ due to the different electrical conductivities of these materials with little C contamination bleeding into the h-BN$^2$ region.

These sheets are particularly useful for ultraflat 3-dimensional electronics, where alternating h-BN and graphene regions can act as a wire array connected by lateral insulators. Since such an array maintains a uniform thickness throughout, the device will remain flat even after multiple transfers of such sheets without any post processing, such as chemical mechanical polishing. This is demonstrated in FIGS. 3B and 3C, where a large sheet of i-G$^1$/h-BN$^2$ lines is fabricated and performed multiple transfers onto a single substrate. After transferring the first sheet, a second was placed perpendicular to the first with each layer contacted by electrodes. Optical images (FIG. 3B) show the structural uniformity of the final devices at different scales. The flatness and electrical properties of one such graphene-graphene crossed junction (FIG. 3B, inset) is studied by AFM height (left) and EFM phase (right) measurements (FIG. 3C). Topographically, region A (h-BN on h-BN) is virtually indistinguishable from region B (h-BN on graphene), as shown by the height histograms from each region. This stands in stark contrast to the EFM phase image, where both the bottom and top graphene strips are detected with nearly identical phase shifts. The small difference between the EFM phases of the two areas nevertheless indicates that the h-BN on top of the bottom graphene strip is acting as a dielectric film. Electrical measurements (FIG. 3C, right) of these connections show a negligible addition of a contact resistance, confirming that such films behave as atomically flat 3-dimensional interconnects. Although the vertical tunneling current through one layer of h-BN is significant, few layer h-BN formed by additional transfers could be used to electrically isolate devices vertically as well, and allow fabrication of other passive elements, such as capacitors.

Figure 4D:
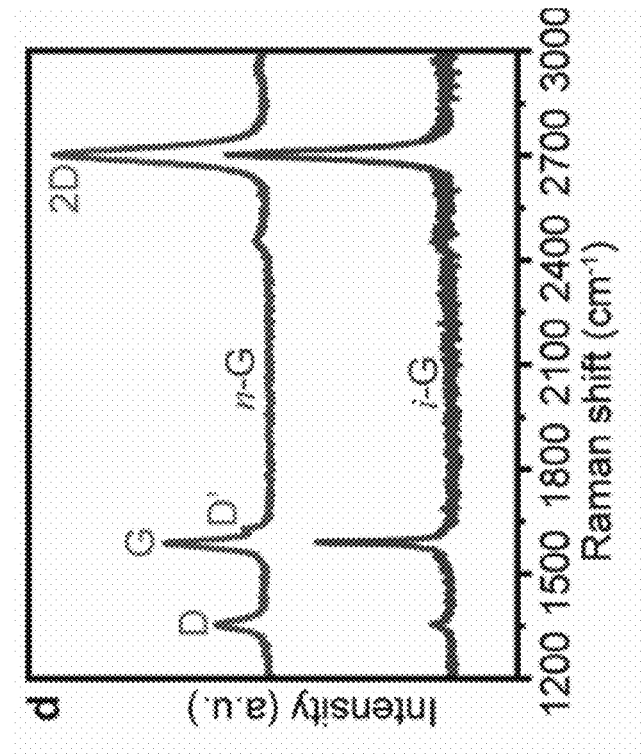
FIG. 4D Raman spectroscopy of n-doped (n-G) and i-G growths (both synthesized in second step in order to allow direct comparison)
Figure 4C:
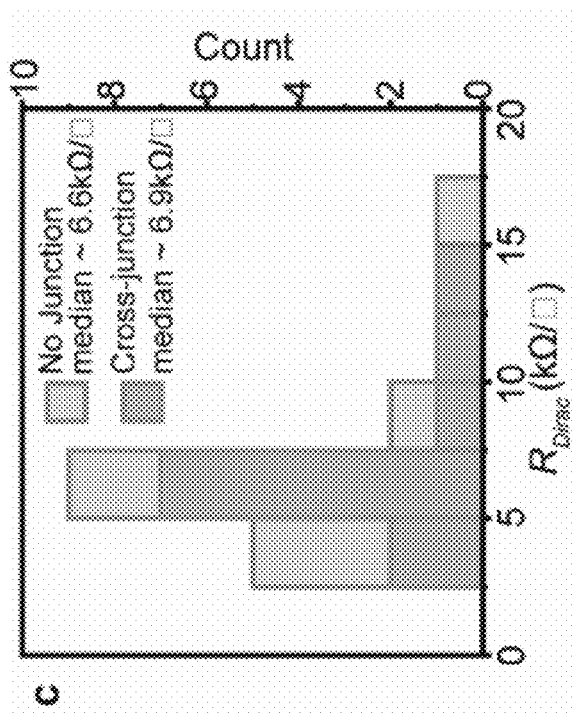
FIG. 4C shows histograms of Dirac point sheet resistance ($R_{Dirac}$) for devices with and without junction regions.

Unlike the case of G/h-BN structures, however, electrically conductive heterojunctions require characterization and optimization of the junction resistance. For this purpose, arrays of devices were fabricated that contained zero to four i-$G^1$/i-$G^2$ junctions. A false color SEM of an example cross-junction device is shown in FIG. 4a. The sheet resistance at the Dirac point ($R_{Dirac}$) for each device was measured using top-gated four-terminal measurements (FIG. 4B) and compiled for statistical comparison (FIG. 4C). Devices with (orange; 15 devices) and without (grey; 19 devices) junctions show both narrow distributions of $R_{Dirac}$, as well as similar medians (no junction: 6.6 k$\Omega$/□; cross-junction: 6.9 k$\Omega$/□). This shows that the electrical properties of heterojunction devices are similar to that of devices without junctions, despite the presence of many smaller grains in the junction area (FIG. 1). Additionally, field-effect carrier mobilities near the Dirac point remain high (>10,000 cm$^2$/V·s) for both types of devices, which is consistent with the properties of electrically-transparent, laterally-connected grain boundaries grown under reactive growth conditions.

Figure 4G:
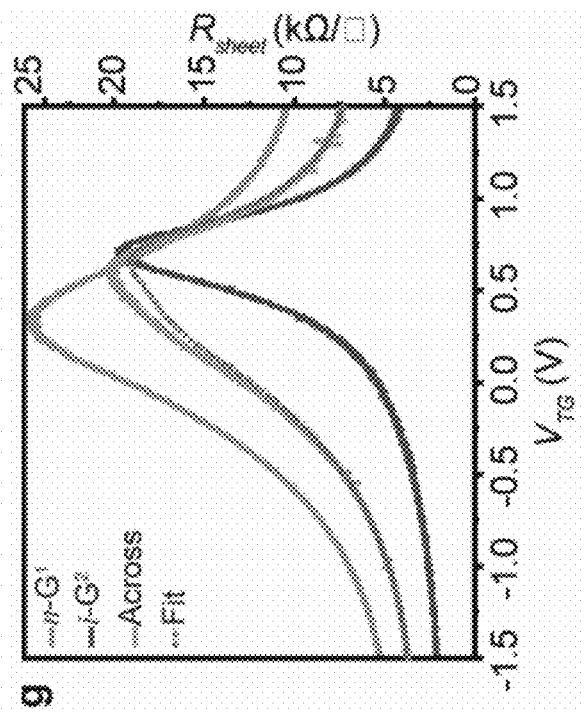
FIG. 4G shows that gate dependence of the junction region is in good agreement with an area weighted average of the homogenous regions (red line, $\Delta R_{junction}$~0.15 kΩ-µm)
Figure 4E:
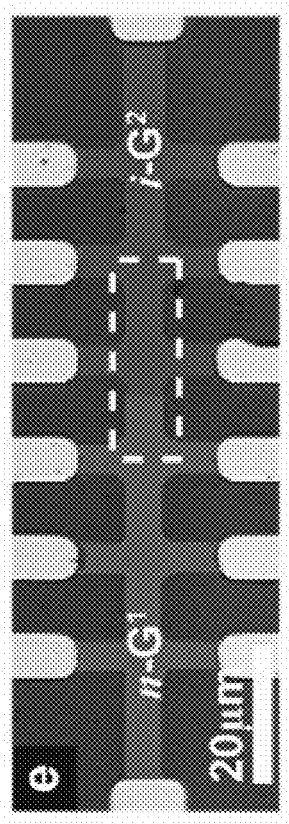
FIG. 4E is an optical image with false color overlay of a heterojunction device.
Figure 4F:
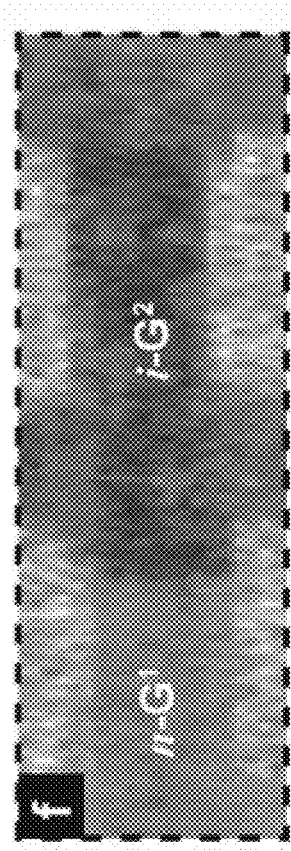
FIG. 4F is a 2-dimensional Raman mapping of the ratio of the integrated D' and G peaks.

Embodiments of the method thus allow for the growth of doped heterostructures, such as p-n junctions, within a single sheet of graphene, which could enable the production of active components with mechanically and electrically continuous junctions. FIG. 4E shows a false color optical image of a device with two differently doped graphene areas (n-$G^1$/i-$G^2$). The n-doped graphene area exhibits an additional D' peak (due to the presence of substitutional nitrogen dopants; FIG. 4D, red curve) that is not typically seen in i-G growths (blue curve). The location of the junction region was thus confirmed using 2-dimensional Raman mapping of the ratio of the integrated D' and G peaks (FIG. 4F), where the n-$G^1$ region is much brighter. Electrical measurements within and across these regions again confirm electrical continuity across this region. Using top gates (Cr/Au 5/45 nm, 100 nm of evaporated SiO$_2$) the gate dependence is measured in different regions, as shown in FIG. 4G (n-$G^1$/i-$G^2$). The device shows behavior consistent with high quality graphene, even across the junction region. The gate dependence of $R_{sheet}$ in this area is in excellent agreement with an area weighted average of the n-$G^1$ and i-$G^2$ areas with the addition of the small resistance $\Delta R_{junction}$~0.15 k$\Omega$-$\mu$m (consistent with the small junction resistance seen in FIG. 4C).

Figure 5A:
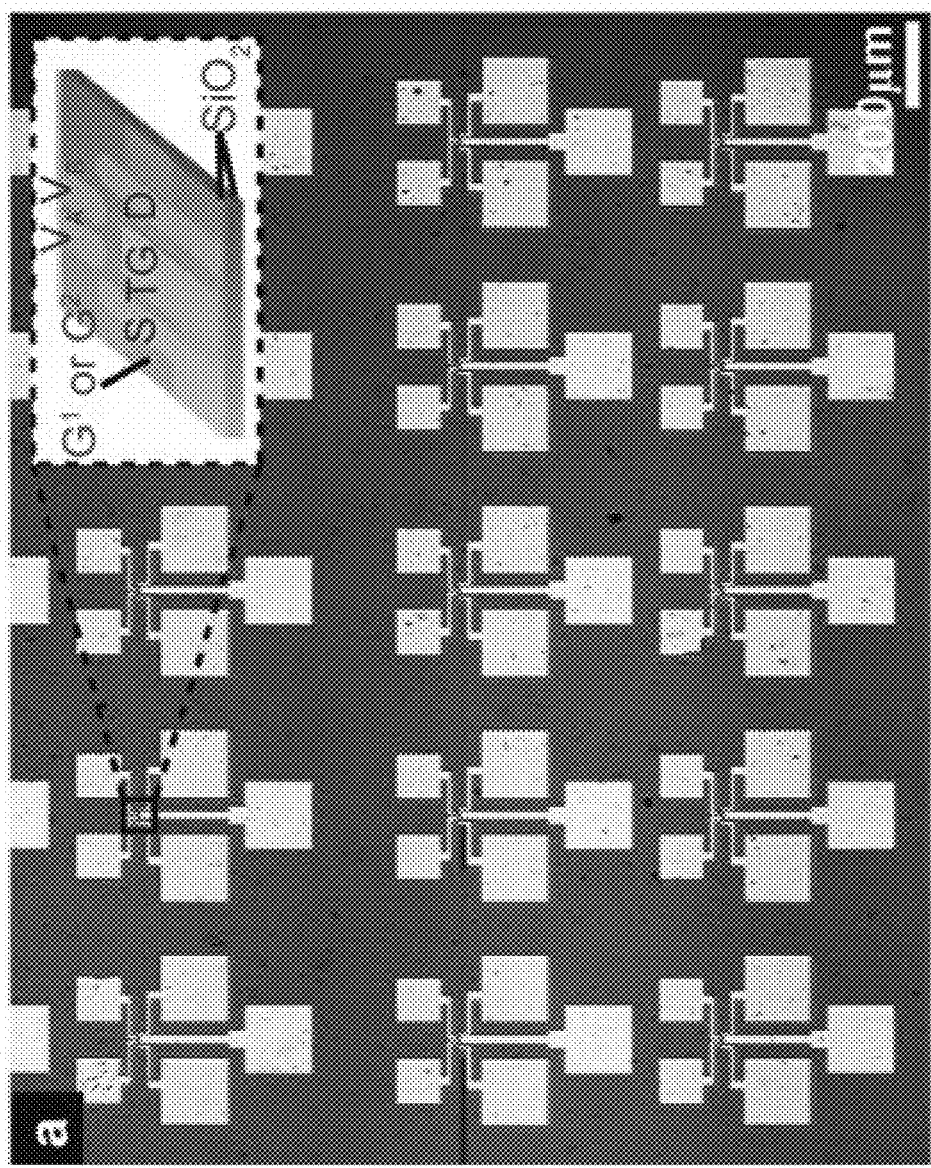
FIG. 5A is an optical image of an array of graphene transistors with device schematic (inset)
Figure 5B:
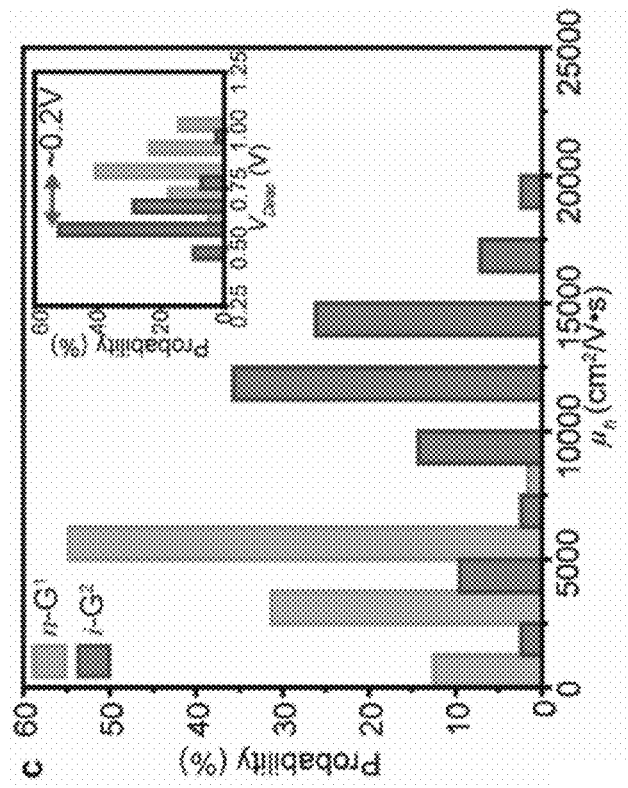
FIG. 5B is a probability distribution of hole mobilities ($\mu_h$) for i-G$^1$ (70 devices) and i-G$^2$ (28 devices) arrays. Inset: Probability distribution of the Dirac point for each array showing a difference (0.8 V) in the mean position.
Figure 5C:
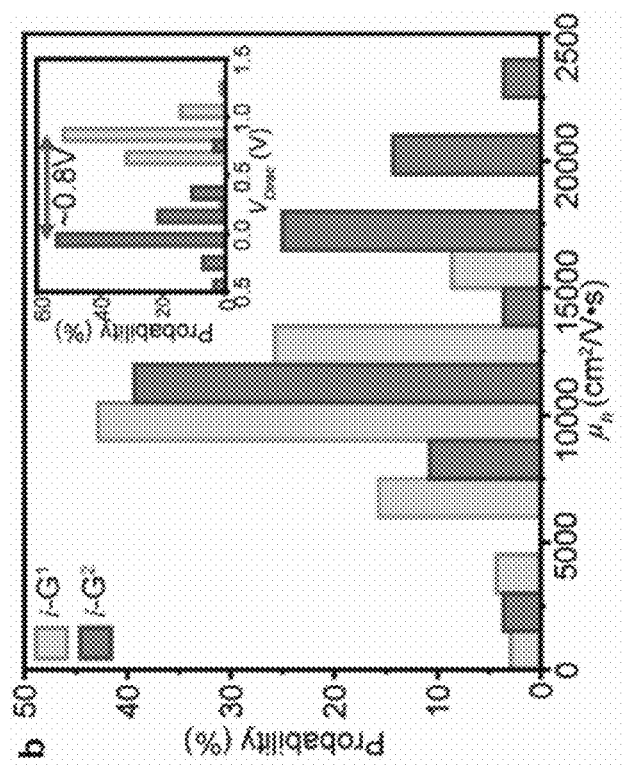
FIG. 5C is a probability distribution of $\mu_h$ for n-G$^1$ (orange; 65 devices) and i-G$^2$ (43 devices) regions. Inset: The Dirac point distributions are now much closer to the i-G$^2$ reference (0.2 V)

Multiple iterations of patterned regrowth would allow the formation of more complex circuits connected by lateral heterojunctions, while multiple transfers of these films would produce vertical heterojunctions and interconnects for increased functionality. In order to realize more complicated structures, it is essential that the electrical properties of sheets grown at different steps are affected by the processing in a reproducible manner. FIG. 5 shows statistics for intrinsic (both i-$G^1$ and i-$G^2$) and n-doped graphene device arrays (optical image shown in FIG. 5A), which exhibit high-performance electrical properties. Namely, they show high field-effect mobilities (again mean>10,000 cm$^2$/V·s; FIG. 5B) and low hysteresis. While there may be a slight difference between the i-$G^1$ and i-$G^2$ mobility distributions (FIG. 5B), these values are consistent with variations seen from growth to growth (see i-$G^2$ in FIG. 5C), suggesting that high electrical performances may be achieved even after multiple regrowth processes. In addition, the Dirac point shows a narrow distribution within each area for both intrinsic and n-doped graphene growths (see FIG. 5B, 5C, insets). There is a shift of ~0.8 V between the Dirac point distribution of the i-$G^1$ and i-$G^2$ growths (FIG. 5B, inset); however, the magnitude of this shift is reduced when the first growth is n-doped (~0.2 V, FIG. 5C, inset). While this is consistent with the expected effects of n-doping, the overall device appears to remain p-type, likely due to the effects of the fabrication process. Thus, improvement in the transfer and fabrication steps should lead to increased control over not only the Dirac point distributions, but also general homogeneity.

Certain embodiments of the patterned regrowth technique provides a versatile and scalable method for growing and integrating layered materials, beyond h-BN and graphene, for atomically thin circuitry. In particular, the addition of two-dimensional semiconducting materials, such as MoS$_2$, would bring together the three key building blocks (insulator, metal, and semiconductor) of modern integrated circuitry into a single, transferrable film. Furthermore, the devices made using this approach are likely to remain mechanically flexible and optically transparent, allowing transfer to arbitrary substrates for flexible, transparent electronics.

Method Embodiments

Patterned Regrowth. Synthesis of graphene and h-BN were carried out in a He leak checked semiconductor grade tube furnace using 25 $\mu$m thick Cu as the growth substrate. Graphene growths were performed at 1000° C., using the general methods known in the art. For intrinsic graphene (i-G) flow rates were H$_2$: 100 sccm, CH$_4$: 6 sccm. For n-doped graphene (n-G) the flow rates were H$_2$: 100 sccm, CH$_4$: 2 sccm NH$_3$: 7 sccm. For the first growth ($G^1$) Cu substrates were annealed in H$_2$ at T=1000° C. for 1 hour prior to introduction of CH$_4$. Photolithography was then performed directly on the Cu substrate in order to pattern a protective layer of photoresist. An O$_2$ reactive ion etch (100 W, 105 s) was used to remove the unwanted graphene from the surface. The patterned Cu was then immediately placed in Microposit Remover 1165 in order to thoroughly clean the surface of residual photoresist. Immediately after this, the substrates were placed directly back into the reaction chamber for the second graphene or h-BN growth. For the second growth samples were exposed to growth reactants upon reaching the growth temperature. h-BN syntheses were carried out for 5 to 15 minutes by sublimation of the ammonia-borane. For the "slow" growth h-BN (FIG. 2A), the effective flow rate from the precursor was ~1 sccm. For the "fast" growth, the flow rate was increased to ~4 sccm. In certain embodiments, an additional carrier gas was not used as this may lead to thicker films.

In general, a method of forming a mechanically continuous hybrid thin film according to the present invention may comprise the following steps as illustrated in FIG. 6. A first film of a first material may be grown on a first substrate 102. A first material may be removed from selected regions of the first film 104. A second film of a second material may be grown in the selected regions of the first film such that the first film and second film form a mechanically continuous hybrid thin film having one or more lateral junctions between the first film and second film 106.

While the disclosure is susceptible to various modifications and alternative forms, specific exemplary embodiments of the present invention have been shown by way of example in the drawings and have been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

What is claimed is:

1. A method of forming a mechanically continuous hybrid thin film, comprising:
    growing a first film of a first material on a first substrate;
    removing first material from selected regions of the first film; and
    growing a second film of a second material in the selected regions of the first film such that the first film and second film form a mechanically continuous hybrid thin film having one or more lateral junctions between the first film and second film.

2. The method of claim 1, wherein the first material is a first conductive material.

3. The method of claim 1, wherein the second material is a second conductive material, an insulating material, or a semiconducting material.

4. The method of claim 1, wherein the first material is graphene.

5. The method of claim 4, wherein the second material is a substitutionally doped graphene.

6. The method of claim 5, wherein the substitutionally doped graphene is either N-doped or B-doped graphene.

7. The method of claim 3, wherein the second material is hexagonal boron nitride.

8. The method of claim 3, wherein the second material is selected from two dimensional metal dichalcogenides (TMDs).

9. The method of claim 8, wherein the TMD is molybdenum disulfide or molybdenum diselenide.

10. The method of claim 1, wherein growing the first film and/or growing the second film is performed under conditions that promote uniform lateral connectivity between the first film and second film.

11. The method of claim 10, wherein the conditions include a highly reactive environment.

12. The method of claim 5, wherein the one or more lateral junctions are electrically continuous.

13. The method of claim 12, wherein resistance across the lateral junctions is less than 110% of resistance of a non-junction region of the first film.

14. The method of claim 7, wherein regions of the continuous film comprising graphene exhibit conductivity and regions of the mechanically continuous thin film comprising boron nitride exhibit insulating characteristics.

15. The method of claim 1, further comprising stacking a plurality of mechanically continuous hybrid thin films according to claim 1 on top of each other on a substantially planar second substrate.

16. The method of claim 15, wherein the second substrate is a semiconductor.

17. The method of claim 1, wherein first material is removed from selected regions of the first film using photolithography and reactive ion etching.

18. The method of claim 1, wherein the mechanically continuous hybrid thin film is an atomically thin film.

* * * * *